United States Patent [19]

Hiramoto

[11] Patent Number: 4,500,565
[45] Date of Patent: Feb. 19, 1985

[54] DEPOSITION PROCESS
[75] Inventor: Tatsumi Hiramoto, Machida, Japan
[73] Assignee: Ushio Denki Kabushiki Kaisha, Tokyo, Japan
[21] Appl. No.: 536,517
[22] Filed: Sep. 28, 1983
[51] Int. Cl.³ .............................................. B05D 3/06
[52] U.S. Cl. ......................................... 427/39; 427/74
[58] Field of Search ................................... 427/39, 74
[56] References Cited
U.S. PATENT DOCUMENTS
3,472,679  10/1969  Ing et al. ................................ 117/93

Primary Examiner—Bernard D. Pianalto
Attorney, Agent, or Firm—Ziems, Walter & Shannon

[57] ABSTRACT

Disclosed herein is a deposition process which comprises, in an air-tight reaction vessel, generating a plasma through a discharge gas by means of a discharge system, disposing a substrate at a position apart from the plasma by a distance greater than the mean free path of species produced by the plasma in such a state that the substrate can be exposed directly to light radiated from the plasma, feeding a carrier gas and photoreactive gas in such a manner that they flow along the substrate, and causing the photoreactive gas to undergo a reaction by the light from the plasma to deposit the reaction product on the substrate. In the deposition process the substrate and a film deposited thereon are prevented from contamination or damage by charged particles. Electrodes are kept free from deposition of the reaction product, thereby allowing to conduct the deposition operation for a long period of time without need for cleaning them frequently.

8 Claims, 5 Drawing Figures

DEPOSITION PROCESS

BACKGROUND OF THE INVENTION (1) Field of the Invention

This invention relates to a deposition process, and more specifically to a deposition process making use of a plasma so that a photoreactive gas is caused to undergo a reaction by light radiated from the plasma and the reaction product is deposited on a substrate.

(2) Description of the Prior Art

A variety of research has been carried out and is still under way to form amorphous silicon films having relatively large areas by deposition processes which films are useful as materials for fabrication of photosensitive drums in electrostatic photocopiers and solar batteries. Besides, it has also been investigated to form insulative films and protective films by the deposition process, as disclosed for example in Japanese Patent Laid-open No. 163,792/1979. As led by the above researches and investigations, a variety of deposition processes has been proposed.

The present invention relates especially to a chemical decomposition deposition process making use of a photochemical reaction, which process is a sort of deposition process. The chemical decomposition deposition process has such merits that its film-forming velocity is very high and a deposition over a large area can be effected advantageously. Owing to these merits, the chemical decomposition deposition process has recently attracted special attention.

The conventional chemical deposition process making use of a photochemical reaction comprises, as disclosed in the aforementioned specification, disposing a substrate for deposition in a vessel made of a material which permits transmission of ultraviolet rays with a high efficiency, feeding a photoreactive gas into the vessel and causing the photoreactive gas to flow through the vessel, irradiating ultraviolet rays externally from a u.v. discharge lamp onto the substrate to cause the photoreactive gas to undergo a photochemical reaction and allowing the reaction product of the photochemical reaction to deposit on the substrate. Although the chemical decomposition deposition process has, as mentioned above, such merits that its film-forming velocity is high and it may be applied to large substrates, it has been found to involve such drawbacks that the reaction product is also allowed to deposit possibly on the inner wall of the vessel and the transmission of ultraviolet rays is thus impaired to a considerable extent.

It is difficult to wash the inner wall of the vessel frequently in an actual film deposition work. With a view toward overcoming this problem, some special vessels and reactors have been proposed. However, they are complex in structure and difficult in handling.

SUMMARY OF THE INVENTION

An object of this invention is to provide a novel deposition process which has completely solved the above-mentioned drawbacks.

In one aspect of this invention, there is thus provided a deposition process which comprises, in an air-tight reaction vessel, generating a plasma through a discharge gas by means of a discharge system, disposing a substrate at a position apart from the plasma by a distance greater than the mean free path of species produced by the plasma in such a state that the substrate can be exposed directly to light radiated from the plasma, feeding a carrier gas and photoreactive gas in such a manner that they flow along the substrate, and causing the photoreactive gas to undergo a reaction by the light from the plasma to deposit the reaction product on the substrate.

In the chemical decomposition deposition process according to this invention, which process make use of a photochemical reaction, a plasma which is a radiation source for ultraviolet rays is generated in the same inner space of the reaction vessel for disposing a substrate on which the reaction product is to be deposited. Between the plasma and the substrate, no barrier which may interfere with the light radiated from the plasma is provided. Further, the deposition is carried out by disposing the substrate at a position apart from the plasma by a distance greater than the mean free path of ions and electrons present in the plasma. Accordingly, the deposition process of the present invention has solved all the drawbacks which conventional chemical decomposition deposition processes utilizing light are accompanied by, without contaminating or damaging the substrate or deposited film by charged particles. Besides, deposition of the reaction product on discharging electrodes can be avoided and the desired deposition operation can be carried out for a long period of time, if a protective gas is caused to flow around the discharging electrodes.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
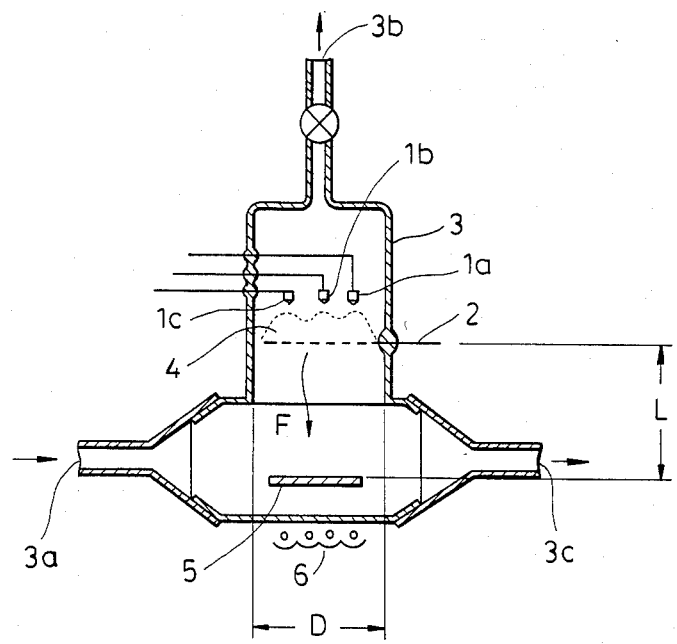
FIG. 1 is a schematic cross-sectional view showing one example of an apparatus useful in the practice of the process of this invention.

In the drawings, numerals 1a, 1b, 1c indicate cathodes which are arranged in side-by-side relationship. Designated at numeral 2 is a mesh-type anode. The cathodes 1a, 1b, 1c and anode 2 are disposed with a predetermined interval therebetween in a vessel 3. A plasma 4 is generated by discharges which take place between the cathodes 1a, 1b, 1c and the anode 2. More cathodes may be employed depending on the size of an intended plasma. A photochemically reactive gas is fed through an inlet 3a of the vessel 3 and is then drawn out through two outlets 3b, 3c. Exhaust pumps (not shown) are respectively connected to the outlets 3b, 3c. By suitably choosing the capacity of each of the exhaust pumps in view of the exhaust resistance and the like of the vessel 3, it is possible to control the flow velocity of the photochemically reactive gas passing by a substrate 5 or passing through a space in which the plasma 4 is generated. The substrate 5 is positioned right under the anode 2 at a position apart from the plasma by a distance greater than the mean free path of the species produced by the plasma. Numeral 6 indicates an infrared ray heater unit which is optionally provided where the heating of the substrate 5 is desired. A specific exemplary design of such an apparatus will be given as follows.

Portion surrounding the space where the plasma 4 is generated—A cylinder having an inner diameter (D) of 20 cm Cathodes 1a, 1b, 1c—Rods of tungsten including thoria, each, of 3 mm in diameter Anode 2—Tungsten mesh Distance between the lower extremity of each cathode and the tungsten mesh—25 mm In the above design, the plasma 4 is generated in a disc-like shape of approximately 18 cm in diameter and 2.5 cm in height. Radiant light F from the plasma 4 travels through apertures of the tungsten mesh 2 toward the substrate 5. When the plasma 4 is generated in the above-mentioned size, it is possible to treat substrates of up to 5 inches in diameter. By the way, the substrate 5 is actually held on a support, for example, a disc made of silica glass. Such a support is however omitted from the drawings.

In one embodiment of this invention which was carried out using the above-described apparatus, a mixed gas was fed into the vessel so that the partial pressure of argon gas as a carrier gas being 1 mmHg, the partial pressure of mercury vapor as a photosensitizer being $1 \times 10^{-3}$ mmHg and the partial pressure of silane gas as a photoreactive gas being 0.1 mmHg. Discharges were then developed by applying an electrical potential of 30 V and current of 3A between the cathodes and anode, thereby generating a plasma. The substrate 5, which has been maintained at about 50° C., was placed at a position whose distance L from the plasma was greater than the maximum mean free path (about 0.8–1 cm as calculated theoretically) of species to be produced by the plasma, such as ions and electrons. The distance L was set at 8 cm by way of example. The deposition was then carried out to form a amorphous silicon film on the substrate. The film forming velocity was 4000 Å per 10 minutes.

Figure 2:
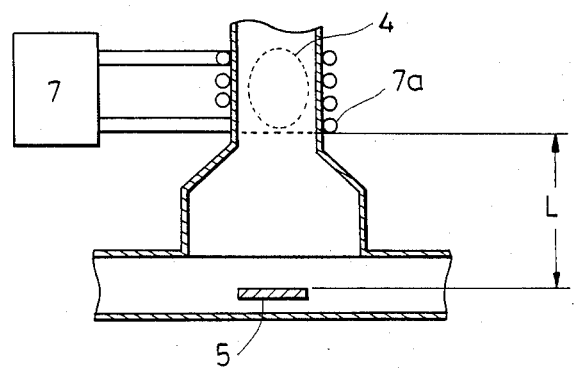
FIG. 2 is a schematic cross-sectional view illustrating another example of an apparatus useful in the practice of the process of this invention.

FIG. 2 illustrates another embodiment of the apparatus, which employs a high frequency power source to generate the plasma 4. Numeral 7 indicates a high frequency power source of, for example, 6 MHz and 1.5 KW. Designated at numeral 7a is a coil connected to the high frequency power source 7. A substrate 5 is placed at a position 10 cm apart from the lower extremity of the coil 7a, in other words, at a level where L=10 cm. In this apparatus, a deposited amorphous silicon film was formed under the same mixed gas and pressure conditions as those employed in the above example which was carried out using the apparatus illustrated in FIG. 1. The filmforming velocity was about 4500 Å per 10 minutes.

As has been readily understood from the above examples, there is no barrier such as a vessel wall between the plasma, which serves as a stimulant light source for the photochemical reaction, and the substrate 5 in the process of this invention. Thus, the present process is free from the problem of reaction product depositing on such a barrier and impeding transmission of radiant light from the plasma 4 through the barrier. Accordingly, it is possible to carry out the desired deposition relying upon a photochemical reaction over a long period of time. Moreover, since each substrate is placed at a position outside the mean free path of ions and electrons produced by the plasma 4, the substrate and a film to be deposited thereon will be free from contamination or damage by such electrons and ions.

Incidentally, the mean free path of ions and/or electrons can be theoretically calculated on the basis of ion species produced in the plasma, the energy of electricity applied for developing discharges, the gas pressure, etc. It is however recommended to place each substrate by determining the value L while taking a value approximately 10 times the theoretically calculated value as a standard in order to ensure the safety of the substrate.

Figure 3:
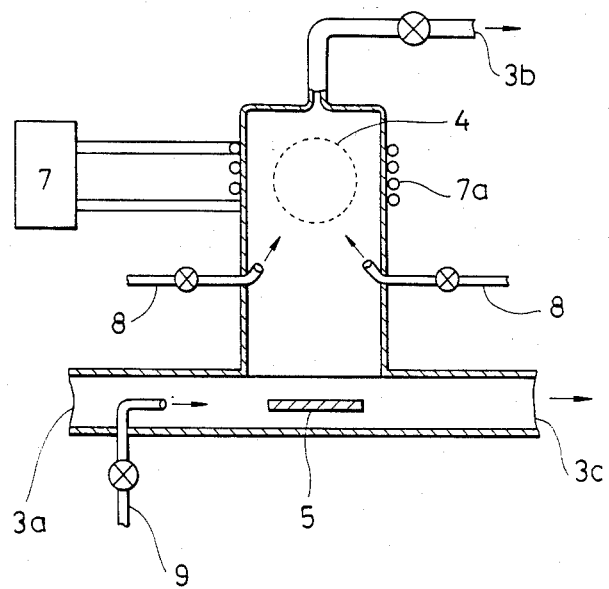
FIG. 3 is a schematic cross-sectional view depicting a further example of an apparatus useful in the practice of the process of this invention.

In the above process, a photoreactive gas is caused to undergo a chemical reaction by light radiated from the plasma and the reaction product is deposited as a film on the substrate. The photoreactive gas is not limited to that employed in the above example but may be chosen from a wide variety of photoreactive gases. It is for example feasible to form a deposited film of silicon nitride by feeding a nitrogen oxide such as nitrogen dioxide or a nitrogen-containing reactive gas such as ammonia through a pipe 9 so that it merges into the gas stream passing near the substrate, as is shown in FIG. 3. Furthermore, it is also possible to form on a substrate a deposited film of As-, P- or B-doped amorphous silicon by feeding arsenic hydride, phosphorus hydride or boron hydride as a photoreactive gas through the pipe 9.

Irrespective of the deposited film to be formed, the substrate-placing position is chosen at a position farther from the plasma than the mean free path of ions and electrons produced in the plasma. This is effective in avoiding the contamination or damage of the substrate and those of the film formed thereon. In addition, no reaction takes place by charged particles in the vicinity of the substrate. Thus, a film can be formed at a high velocity and deposition onto large areas can hence be facilitated.

As a power source for generating the plasma, it is possible to use either a d.c. power source or an a.c. power source.

FIG. 3 illustrates another embodiment of the deposition process according to this invention. In this embodiment, there is used an apparatus similar to that shown in FIG. 2. A gas composed of an element having a resonance line in the ultraviolet region such as arsenic, phosphorus or boron, for example, a gas of hydride of said element is caused to flow from another feed pipe 8 toward the space where plasma is generated. This permits the plasma to activate the element, thereby radiating ultraviolet rays of specific wave length which are then irradiated to the photoreactive gas passing near the substrate.

Figure 4:
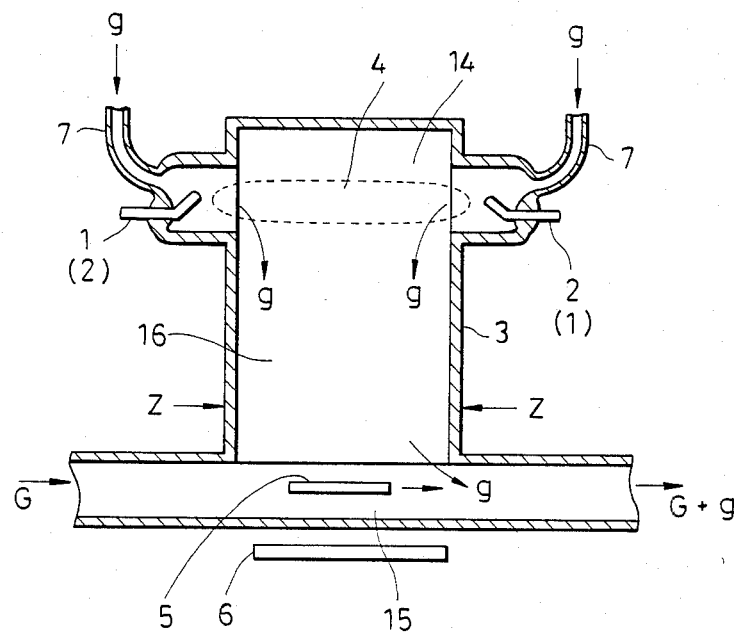
FIG. 4 is a schematic cross-sectional view of a still further example of an apparatus useful in the practice of the process of this invention.
Figure 5:
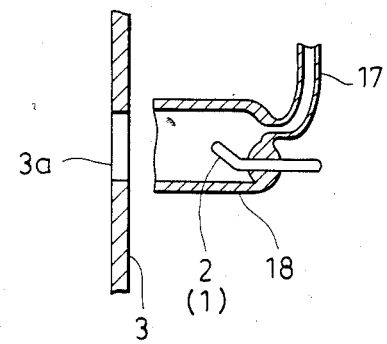
FIG. 5 is a view illustrating the way of fabrication of an essential part of the apparatus of FIG. 4.

FIG. 4 depicts an apparatus useful in the practice of a further embodiment of this invention. The vessel 3 is provided, as shown in FIG. 5 by way of example, with a pair of bowl-shaped glass members 18. One of the bowl-shaped glass members 18 is provided with the cathode 1 and a gas-feeding pipe 17 through which a protective gas is fed. The other bowl-shaped glass member 18 is provided with the anode 2 and a gas-feeding pipe 17 through which a protective gas is charged. As illustrated in FIG. 5, the glass members 18 may be attached to the main body of the vessel 3 by fuse-fitting the glass members 18 in such a way that they close up their respective bores 3a formed through the wall of the main body of the vessel 3. Alternatively, the vessel 3 may be divided along line z—z in FIG. 4. The proximal edge portions of the thus-divided portions of the vessel 3 are each formed into e.g., a "ground-fitting" structure as commonly seen in laboratory glass apparatus so that they may be air-tightly coupled together. The air-tight coupling may be ensured by applying grease to the "ground-fitting" portions. The vessel 3 may be made of silica glass. It is important that a plasma-generating space 14 and a photoreactive gas flowing space 15 are connected with a communication space 16 and these three spaces 14, 15, 16 are surrounded by the single vessel 3 without allowing a barrier to be present therein. A deposition operation was carried out by way of example, using the above-described apparatus. As the substrate 5, an alumina plate was used and was heated to about 150° C. A photochemically reactive gas G, was fed to flow through the photoreactive gas flowing space 15, so that the partial pressure of argon as a carrier gas was 5 mmHg, the partial pressure of mercury vapor as a photosensitizer was $3 \times 10^{-3}$ mmHg and the partial pressure of silane gas as a photoreactive gas was 0.3 mmHg. As an electrode-protecting gas g, which was a mixed gas was fed so that the partial pressure of argon was 8 mmHg, and the partial pressure of mercury vapor was $2 \times 10^{-3}$ mmHg. This gas g was utilized also as a discharge gas for the generation of plasma. Then, an electric power of 100 V and 8 A was supplied between the cathode 1 and anode 2 to generate a plasma 4 in the plasma-generating space 14. Light radiated from the plasma 4 was irradiated to the silane gas present in the photochemically reactive gas G. Accordingly, the silane gas was caused to undergo a photodecomposition and amorphous silicon was thus deposited on the substrate 5. The deposited layer was formed to a thickness of about 0.3 μm in 10 minutes.

In the above embodiment, a protective gas feeding system is provided so that the electrode-protecting gas passes around the cathode 1 and the anode 2. Therefore, while deposition of the products which are produced by the photodecomposition of the photoreactive gas is carried out efficiently as in the preceding examples because there is no impeding of the photoreaction due to the interference of the transmission of the radiant light, the products of the photodecomposition which may diffuse through the communication space 16 are prevented from reaching and depositing on the surfaces of the discharging electrodes by the flow of the protective gas. As a result, a stable discharge is continued. More specifically, the cathode 1 is generally coated at the surface thereof with an electron-emitting material such as a mixture of the oxides of Ba, Sr and Ca, which mixture is commonly used for electrodes in low-pressure mercury discharge lamps and fluorescent lamps. Unless the protective gas is fed, various reaction products which are produced by photochemical reactions are caused to deposit on the surface of the cathode and eventually to cover the cathode while the deposition operation is repeatedly carried out, although the deposition of such reaction products takes place little by little. Accordingly, the electron-radiating ability of the cathode is impaired considerably and the discharge will eventually become very difficult to continue. However, by forming a stream of the protective gas around the cathode as in the present example, reaction products are prevented from depositing on the cathode. Therefore, a stable discharge may be maintained over a long period of time. The effectiveness of such a protective gas is not limited to the cathode 1 but may also be exhibited with respect to the anode 2.

In the above embodiment, the discharge gas and electrode-protecting gas are the same. It is of course possible to feed gases of different compositions from different supply ports. The electrodes may be formed and arranged directed toward the discharge space so as to generate plasma-jet where the discharge gas may also serve as an electrode-protecting gas. This arrangement of the electrodes permits the use of light radiated from the plasma-jet as stimulant light for the photochemical reaction.

The process of this invention may be applied to a variety of substrates in accordance with the object of the process or whatever end use would be made on the resulting products. Similarly, various films may be deposited in accordance with the process of this invention. For example, a protective film of silicon nitride may be formed on a silicon wafer if the silicon wafer is used as a substrate and molecular species containing nitrogen atoms, e.g., ammonia, and silane gas are incorporated in a photochemically reactive gas. The process of the present invention may be applied to form metallic, insulative or protective films or amorphous layers on substrates made of various materials.

Having now fully described the invention, it will be apparent to one of ordinary skill in the art that many changes and modifications can be made thereto without departing from the spirit or scope of the invention as set forth herein.

What is claimed is:

1. A deposition process which comprises, in an airtight reaction vessel, generating through a discharge gas by means of a discharge system a light-radiating plasma producing species, disposing a substrate at a position spaced from the plasma by a distance greater than the mean free path of the species produced by the plasma such that the substrate is exposed directly to light radiated from the plasma, feeding a carrier gas and photoreactive gas in such a manner that said carrier gas and photoreactive gas flow along the substrate, and causing the photoreactive gas to undergo a reaction by the light from the plasma to produce a reaction product, and to deposit the reaction product on the substrate.

2. The deposition process as claimed in claim 1, wherein the discharge gas is the photoreactive gas.

3. The deposition process as claimed in claim 1, wherein the photoreactive gas contains a hydride compound of silicon.

4. The deposition process as claimed in claim 3, wherein the discharge gas contains at least one element selected from mercury, arsenic, phosphorus and boron.

5. The deposition process as claimed in claim 3, wherein the photoreactive gas contains ammonia or nitrogen oxide.

6. The deposition process as claimed in claim 3, wherein the photoreactive gas contains boron hydride, arsenic hydride or phosphorus hydride.

7. The deposition process as claimed in claim 1, wherein a protective gas is fed around electrodes which are exposed in the reaction vessel to generate the plasma.

8. The deposition process as claimed in claim 7, wherein the protective gas is the discharge gas.

* * * * *